United States Patent
Kim et al.

(10) Patent No.: US 12,165,699 B2
(45) Date of Patent: Dec. 10, 2024

(54) TERNARY MEMORY CELL AND MEMORY DEVICE COMPRISING SAME

(71) Applicant: UNIST(ULSAN NATIONAL INSTITUTE OF SCIENCE AND TECHNOLOGY), Ulsan (KR)

(72) Inventors: Kyung Rok Kim, Ulsan (KR); Jae Won Jeong, Seoul (KR); Young Eun Choi, Ulsan (KR)

(73) Assignee: UNIST(ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 279 days.

(21) Appl. No.: 17/424,490

(22) PCT Filed: Apr. 3, 2020

(86) PCT No.: PCT/KR2020/004558
§ 371 (c)(1),
(2) Date: Jul. 20, 2021

(87) PCT Pub. No.: WO2020/204651
PCT Pub. Date: Oct. 8, 2020

(65) Prior Publication Data
US 2022/0084584 A1  Mar. 17, 2022

(30) Foreign Application Priority Data
Apr. 5, 2019  (KR) .................. 10-2019-0040298

(51) Int. Cl.
*G11C 7/00*   (2006.01)
*G11C 11/408*   (2006.01)
(Continued)

(52) U.S. Cl.
CPC ........ *G11C 11/419* (2013.01); *G11C 11/4085* (2013.01); *G11C 11/4094* (2013.01); *G11C 11/412* (2013.01); *H03K 19/01721* (2013.01)

(58) Field of Classification Search
CPC .............. G11C 11/419; G11C 11/4085; G11C 11/4094; G11C 11/412; G11C 8/16; G11C 7/1006; H03K 19/01721; H03K 19/09429
(Continued)

(56) References Cited

U.S. PATENT DOCUMENTS 5,966,324 A     10/1999  Wada et al.
7,489,540 B2 *   2/2009  Ramaraju ............. G11C 11/413
                                                           365/156
(Continued)

FOREIGN PATENT DOCUMENTS

JP     1995-065582 A     3/1995
JP     1998-172287 A     6/1998
(Continued)

OTHER PUBLICATIONS

Cho, Geunho et al., Design and process variation analysis of CNTFET-based ternary memory cells., "*Integration*," 54:97-108 (Jun. 2016).
(Continued)

*Primary Examiner* — Tha-O H Bui
(74) *Attorney, Agent, or Firm* — Klarquist Sparkman, LLP

(57) ABSTRACT

In a memory device including a ternary memory cell, the ternary memory cell may include: a first inverter and a second inverter cross-coupled in a first node and a second node and including a pull-up device and a pull-down device configured to have a constant current pass therethrough upon turn-off; a first read transistor and a first write transistor which are connected to each other in parallel between the
(Continued)

first node and a first bit line; and a second read transistor and a second write transistor which are connected to each other in parallel between the second node and a second bit line, wherein the first read transistor and the second read transistor may have a read access current, which is less than or equal to the constant current, pass therethrough in response to an activated read word line.

16 Claims, 13 Drawing Sheets

(51) Int. Cl.
 *G11C 11/4094* (2006.01)
 *G11C 11/412* (2006.01)
 *G11C 11/419* (2006.01)
 *H03K 19/017* (2006.01)
(58) Field of Classification Search
 USPC .......................................... 365/189.011, 154
 See application file for complete search history.

(56) References Cited

U.S. PATENT DOCUMENTS

| | | |
|---|---|---|
| 7,817,492 B2 | 10/2010 | Kanari |
| 10,133,550 B2 | 11/2018 | Kim et al. |
| 10,325,649 B2 * | 6/2019 | Wang ...................... G11C 7/065 |
| 11,170,292 B2 * | 11/2021 | Seo ........................ G11C 11/412 |
| 2007/0279965 A1 * | 12/2007 | Nakazato ............. G11C 11/4125 365/154 |
| 2013/0182494 A1 * | 7/2013 | Badrudduza .......... G11C 11/412 365/156 |
| 2019/0087719 A1 | 3/2019 | Seo et al. |

FOREIGN PATENT DOCUMENTS

| | | |
|---|---|---|
| KR | 10-0955251 B1 | 4/2010 |
| KR | 10-1689159 B1 | 12/2016 |

OTHER PUBLICATIONS

International Search Report and Written Opinion for PCT/KR2020/004558, mailed Jul. 7, 2020 (w/English ISR).
Notice of Allowance for Korean Patent Application No. 10-2019-0040298, Sep. 24, 2020 mailed (w/English translation).
Office Action for Korean Patent Application No. 10-2019-0040298, Jun. 22, 2020 mailed (w/English translation).
Shin, Sunhae, "Ultra-Low Power Ternary CMOS Platform for Physical Synthesis of Multi-Valued Logic and Memory Applications," Graduate School of UNIST, Doctoral Dissertation (Aug. 2017).

* cited by examiner

TERNARY MEMORY CELL AND MEMORY DEVICE COMPRISING SAME

CROSS REFERENCE TO RELATED APPLICATIONS

This is the U.S. National Stage of International Application No. PCT/KR2020/004558, filed Apr. 3, 2020, which in turn claims priority to Korean Patent Application No. 10-2019-0040298, filed Apr. 5, 2019, which applications are incorporated herein in their entireties.

TECHNICAL FIELD

The present disclosure relates to a memory device, and more particularly, to a ternary memory cell and a memory device including the same.

BACKGROUND ART

A ternary logic circuit has been proposed in Public Patent Publication No. 10-1689159 (referred to herein as 'the related art') of the same applicant, which is incorporated herein by reference in its entirety. For example, as a ternary logic circuit, when an inverter receives a ground voltage GND, an intermediate voltage VDD/2, and a positive supply voltage VDD respectively corresponding to ternary logic values, that is, 0/1/2 logic values, the inverter may output a positive supply voltage VDD, an intermediate voltage VDD/2, and a ground voltage GND, respectively corresponding to 2/1/0 logic values. Such a ternary logic circuit may provide an advantage which is capable of processing a greater amount of information than a typical binary logic circuit using a ground voltage GND and a positive supply voltage VDD corresponding to logic values 0/1.

DESCRIPTION OF EMBODIMENTS

Technical Problem

The present disclosure provides a ternary memory cell and a memory device including the same, wherein the ternary memory cell is configured to be used as a memory device and perform arithmetic operations by using increased information processing capability of a ternary logic circuit.

Solution to Problem

To achieve the above-described object, in a memory device including a ternary memory cell according to an aspect of the present disclosure, the ternary memory cell may include a first inverter and a second inverter cross-coupled in a first node and a second node and including a pull-up device and a pull-down device configured to have a constant current pass therethrough upon turn-off, a first read transistor and a first write transistor which are connected to each other in parallel between the first node and a first bit line, and a second read transistor and a second write transistor which are connected to each other in parallel between the second node and a second bit line, wherein the first read transistor and the second read transistor may have a read access current, which is less than or equal to the constant current, pass therethrough in response to an activated read word line.

According to an example embodiment of the present disclosure, the memory device may further include a page buffer configured to determine a ternary value based on a difference between a first voltage of the first bit line and a second voltage of the second bit line in a read operation.

According to an example embodiment of the present disclosure, the first write transistor and the second write transistor may be configured to have a write access current, which is greater than or equal to the constant current, pass therethrough in response to an activated write word line.

According to an example embodiment of the present disclosure, the first read transistor and the second read transistor may have sizes less than sizes of the first write transistor and the second write transistor.

According to an example embodiment of the present disclosure, the first read transistor and the second read transistor may have greater threshold voltages than that of the first write transistor and the second write transistor.

According to an example embodiment of the present disclosure, the ternary memory cell may be configured to store a ternary value corresponding to a first state in which both of the pull-up device and the pull-down device are turned off, a second state and a third state in which one of the pull-up device and the pull-down device is turned on and the other is turned off, and the pull-up device and the pull-down device may be configured to have a first current pass therethrough in the first state and a second current greater than the first current pass therethrough in the second state and the third state.

In a memory device including a ternary memory cell according to an aspect of the present disclosure, the ternary memory cell may include a first inverter and a second inverter cross-coupled in a first node and a second node and including a pull-up device and a pull-down device configured to have a constant current pass therethrough upon turn-off, a first access transistor connected to the first node and a first bit line, and a second access transistor connected to the second node and a second bit line, wherein the memory device may further include a row decoder configured to provide a read word line voltage to each of the first access transistor and the second access transistor such that a read access current which is less than or equal to the constant current passes through the first access transistor and the second access transistor in a read operation.

According to an example embodiment of the present disclosure, the memory device may further include a page buffer configured to determine a ternary value based on a difference between a first voltage of the first bit line and a second voltage of the second bit line in the read operation.

According to an example embodiment of the present disclosure, the row decoder may be configured to provide a write word line voltage to each of the first access transistor and the second access transistor such that a write access current having a magnitude greater than or equal to the constant current passes through the first access transistor and the second access transistor in a write operation.

According to an example embodiment of the present disclosure, the row decoder may be configured to provide a write word line voltage to each of the first access transistor and the second access transistor such that a write access current having a magnitude greater than or equal to the second current passes through the first access transistor and the second access transistor in a write operation.

Advantageous Effects of Disclosure

According to a ternary memory cell according to an example embodiment of the present disclosure and a memory device including the same, an amount of information stored in a memory cell may increase.

In addition, according to a ternary memory cell according to an example embodiment of the present disclosure and a memory device including the same, the capacity of the memory device including a memory cell may significantly increase due to increased information stored in the memory cell.

In addition, according to a ternary memory cell according to an example embodiment of the present disclosure and a memory device including the same, a memory cell providing good read and write performance and having a reduced area while storing an increased amount of information may be provided.

In addition, according to a ternary memory cell according to an example embodiment of the present disclosure and a memory device including the same, the performance and operational reliability of the memory device including a memory cell may be improved due to good read performance of the memory cell.

Effects which may be obtained in example embodiments of the present disclosure are not limited to the above-mentioned effects, and other effects not mentioned may be dearly derived and understood by those of ordinary skill in the art to which example embodiments of the present disclosure pertain from the following description. That is, unintended effects according to the practice of the example embodiments of the present disclosure may also be derived by those of ordinary skill in the art from the example embodiments of the present disclosure.

MODE OF DISCLOSURE

Figure 1:
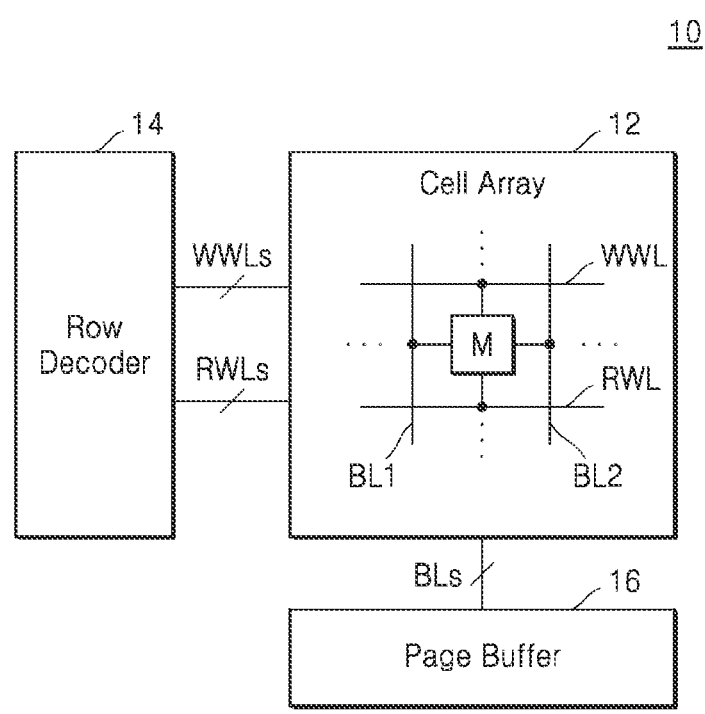
FIG. 1 is a block diagram of a memory device according to an example embodiment of the present disclosure.

Hereinafter, embodiments of the inventive concept will be described in detail with reference to the accompanied drawings. Embodiments of the present disclosure are provided so that this disclosure will be thorough and complete, and will fully convey the concept of the present disclosure to those skilled in the art. As the present disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the spirit and technical scope are encompassed in the present disclosure. Like reference numerals in the drawings denote like elements. Sizes of components in the drawings may be exaggerated or reduced for convenience of explanation.

Specific language has been used to describe particular embodiments in the present specification, but the present disclosure is not limited thereto. An expression used in the singular encompasses the expression of the plural, unless it has a clearly different meaning in the context. In the present specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Unless defined otherwise, all terms used herein, including technical or scientific terms, have the same meaning as commonly understood by one of ordinary skill in the art to which the present disclosure belongs. Terms such as those defined in a commonly used dictionary should be interpreted as having a meaning consistent with the meaning in the context of the related art, and are not interpreted in an ideal or excessively formal meaning unless explicitly defined in the present disclosure.

FIG. 1 is a block diagram of a memory device 10 according to an example embodiment of the present disclosure. In particular, FIG. 1 shows a cell array 12, a row decoder 14, and a page buffer 16 as some components included in the memory device 10.

The memory device 10 may receive a command or an address from the outside, and may receive or output data. For example, the memory device 10 may receive a command such as a write command and a read command, and an address corresponding to the command. The memory device 10 may receive data in response to the write command, and may output data in response to the read command. In some embodiments, a command, an address, and data may be received or transmitted through independent channels, and in some embodiments, at least two of a command, an address, and data may be received or transmitted through the same channel. In some embodiments, the memory device 10 may refer to any device manufactured through a semiconductor operation. For example, the memory device 10 may be packaged as an independent memory device, or may be included in a semiconductor package such as a system-on-chip or a processor.

The cell array 12 may include a plurality of memory cells (e.g., M). A memory cell M may have three different states, and thus may store ternary logic values corresponding to the three different states. Herein, the ternary logic values that the memory cell M may store may be referred to as '0', '1', and '2', may collectively referred to as '0/1/2', or may be simply referred to as ternary values. In some embodiments, as will be described below with reference to FIG. 2, the memory device 10 may be a static random access memory (SRAM), and may include a ternary logic circuit or a ternary logic device proposed in the related art. An example of the memory cell M will be described below with reference to FIG. 2 or the like. As described above, the SRAM including memory cells capable of storing ternary logic values may be referred to as a ternary SRAM or a T-SRAM.

The cell array 12 may be connected to the row decoder 14 through a plurality of write word lines WWLs and a plurality of read word lines RWLs, and may be connected to the page buffer 16 through a plurality of bit lines BLs. Although not shown in FIG. 1, in some embodiments, the memory device 10 may further include a column decoder arranged between the cell array 12 and the page buffer 16 and selecting some of the plurality of bit lines BLs connected to the cell array 12 according to an address. Herein, the memory device 10 will be mainly described with reference to a structure in which the column decoder is omitted as shown in FIG. 1, but embodiments of the present disclosure are not limited thereto.

As shown in FIG. 1, the memory cell M may be coupled to one write word line WWL from among the plurality of write word lines WWLs and one read word line RWL from among the plurality of read word lines RWLs. In addition, the memory cell M may be coupled to a first bit line BL1 and a second bit line BL2 from among the plurality of bit lines BLs. In some embodiments, the first bit line BL1 and the second bit line BL2 may be complementary. The memory cell M may store ternary logic values, and a method different from that of a memory cell storing binary logic values may be used to write or read the ternary logic values. For example, as will be described with reference to FIG. 2, the memory cell M may form different paths in each of a write operation and a read operation, and the memory cell M may provide good read performance, for example, a high read static noise margin (SNM) and read speed, while storing an increased amount of information. As a result, the performance and operational reliability of the memory device 10 may be improved.

The row decoder 14 may activate one word line (e.g., WWL) from among the plurality of write word lines WWLs according to an address received along with a write command, and may activate one word line (e.g., RWL) from among the plurality of read word lines RWLs according to an address received along with a read command. For example, when the write word line WWL is activated, the memory cell M may be selected, and a value may be written into the memory cell M by voltages and/or currents of the first bit line BL1 and the second bit line BL2. In addition, when the read word line RWL is activated, the memory cell M may be selected, and a value stored in the memory cell M may be read by the voltages and/or currents of the first bit line BL1 and the second bit line BL2. Memory cells connected to the same write word line (or the same read word line) or data stored in the memory cells may be referred to as a page.

The page buffer 16 may be connected to the cell array 12 through the plurality of bit lines BLs. The page buffer 16 may include at least one latch, store data to be written into the cell array 12, that is, write data, in a write operation, and store data read from the cell array 12, that is, read data, in a read operation. The page buffer 16 may include a write circuit, and the write circuit may apply voltages and/or circuits based on write data to the plurality of bit lines BLs in a write operation. In addition, the page buffer 16 may include a read circuit, and the read circuit may generate read data by sensing voltages and/or currents of the plurality of bit lines BLs in a read operation. For example, the page buffer 16 may precharge the first bit line BL1 and the second bit line BL2 to the same voltage before the read word line RWL is activated by the row decoder 14, and when the read word line RWL is activated, the page buffer 16 may determine ternary values based on a difference between a first voltage of the first bit line BL1 and a second voltage of the second bit line BL2. The page buffer 16 may include ternary logic devices, and accordingly, the page buffer 16 may write ternary logic values into the memory cell M or read the ternary values from the memory cell M.

Figure 2:
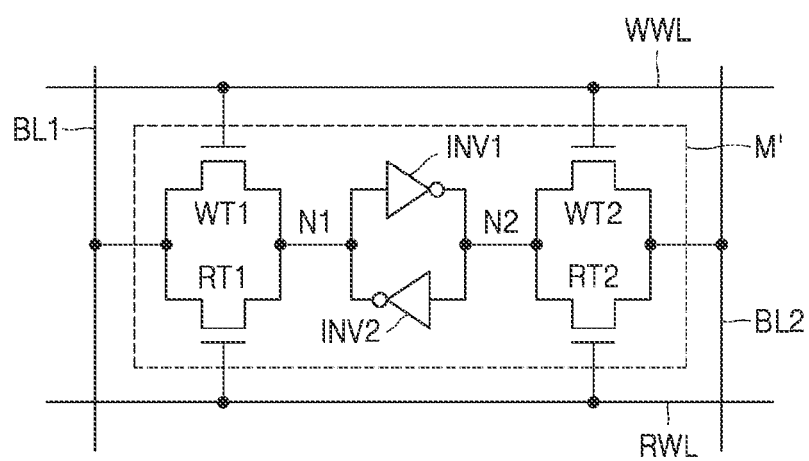
FIG. 2 is a circuit diagram illustrating an example of a memory cell of FIG. 1, according to an example embodiment of the present disclosure.

FIG. 2 is a circuit diagram illustrating an example of the memory cell M of FIG. 1, according to an example embodiment of the present disclosure. As described above with reference to FIG. 1, a memory cell M' of FIG. 2 may be connected to the write word line WWL and the read word line RWL, may be connected to the first bit line BL1 and the second bit line BL2, and may store one logic value from among ternary values, that is, 0/1/2. Hereinafter, FIG. 2 is described with reference to FIG. 1.

Referring to FIG. 2, the memory cell M' may include a first inverter INV1, a second inverter INV2, a first write transistor WT1, a second write transistor WT2, a first read transistor RT1, and a second read transistor RT2. The first inverter INV1 and the second inverter INV2 may be cross-coupled in a first node N1 and a second node N2, and thus, may store one logic value from among 0/1/2. Herein, when the first node N1 is a positive supply voltage VDD and the second node N2 is a ground voltage GND (or a negative supply voltage VSS), the memory cell M may be referred to as storing a logic value 2. In addition, herein, when the first node N1 and the second node N2 are an intermediate voltage (e.g., VDD/2) (or (VDD+VSS)/2), the memory cell M' may be referred to as storing a logic value 1. In addition, herein, when the first node N1 is the ground voltage GND (or the negative supply voltage VSS) and the second node N2 is the positive supply voltage VDD, the memory cell M' may be referred to as storing a logic value 0. Examples of operations of the first inverter INV1 and the second inverter INV2 will be described below with reference to FIGS. 3 and 4.

The first write transistor WT1 may be connected to the first node N1 and the first bit line BL1, and may have a gate (or a control terminal) connected to the write word line WWL. The first write transistor WT1 may electrically connect or disconnect the first node N1 and the first bit line BL1 according to a voltage of the write word line WWL. For example, the first write transistor WT1 may be an N-channel field effect transistor (NFET), which may electrically connect the first node N1 to the first bit line BL1 in response to the write word line WWL which is activated, that is, has a high level of voltage, and may electrically disconnect the first node N1 and the first bit line BL1 in response to the write word line WWL which is inactivated, that is, has a low level of voltage. Similarly to the first write transistor WT1, the second write transistor WT2 may be connected to the second node N2 and the second bit line BL2, and may have a gate (or a control terminal) connected to the write word line WWL. Herein, embodiments of the present disclosure will be described assuming that the first write transistor WT1 and the second write transistor WT2 are NFETs, but the embodiments of the present disclosure may also be applied even to a case where the first write transistor WT1 and the second write transistor WT2 are P-channel field effect transistors (PFETs).

The first read transistor RT1 may be connected to the first node N1 and the first bit line BL1, and may have a gate (or a control terminal) connected to the read word line RWL. The first read transistor RT1 may electrically connect or disconnect the first node N1 and the first bit line BL1 according to a voltage of the read word line RWL. For example, the first read transistor RT1 may be the NFET, which may electrically connect the first node N1 to the first bit line BL1 in response to the read word line RWL which is activated, that is, has a high level of voltage, and may electrically disconnect the first node N1 and the first bit line BL1 in response to the read word line RWL which is inactivated, that is, has a low level of voltage. Similarly to the first read transistor RT1, the second read transistor RT2 may be connected to the second node N2 and the second bit line BL2, and may have a gate (or a control terminal) connected to the read word line RWL. Herein, embodiments of the present disclosure will be described assuming that the first read transistor RT1 and the second read transistor RT2 are NFETs, but the embodiments of the present disclosure may also be applied even to a case where the first read transistor RT1 and the second read transistor RT2 are PFETs.

Figure 3:
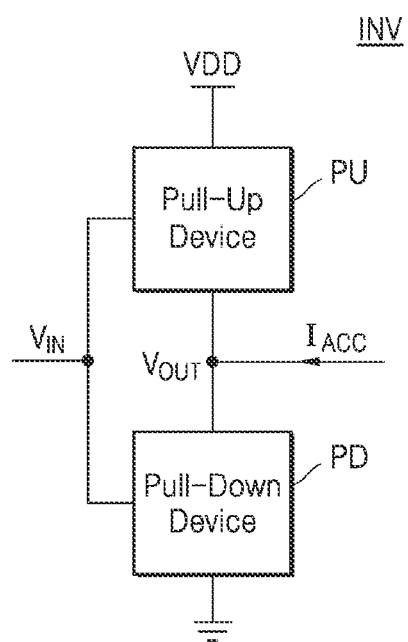
FIG. 3 is a circuit diagram illustrating an example of an inverter of FIG. 2 according to an example embodiment of the present disclosure.
Figure 4:
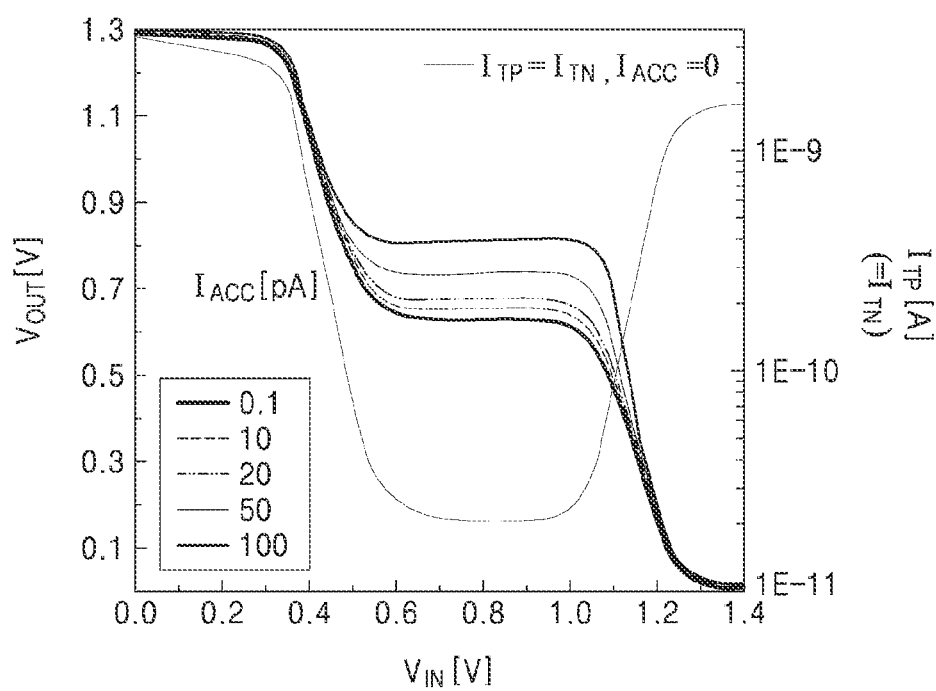
FIG. 4 is a graph showing an example of an operation of the inverter of FIG. 3 according to an example embodiment of the present disclosure.

FIG. 3 is a circuit diagram illustrating an example of the inverter of FIG. 2 according to an example embodiment of the present disclosure, and FIG. 4 is a graph showing an example of an operation of an inverter INV of FIG. 3 according to an example embodiment of the present disclosure. In particular, FIG. 3 shows an inverter generating an output voltage $V_{OUT}$ by inverting an input voltage $V_{IN}$, and the graph of FIG. 4 shows input voltage $V_{IN}$-output voltage $V_{OUT}$ characteristics and input voltage $V_{IN}$-through currents $I_{TP}$ and $I_{TN}$ characteristics. In the graph of FIG. 4, the horizontal axis represents the input voltage $V_{IN}$, the left vertical axis represents the output voltage $V_{OUT}$, and the right vertical axis represents the through currents $I_{TP}$ and $I_{TN}$ on a logarithmic scale. In the graph of FIG. 4, values shown on the horizontal axis and the vertical axes are only examples in which the positive supply voltage VDD is 1.4 V. and characteristics shown in the graph may also appear even at values different from those shown in FIG. 4. Hereinafter, FIGS. 3 and 4 are described with reference to FIG. 2.

Referring FIG. 3, the inverter INV may include a pull-up device PU and a pull-down device PD connected in series between the positive supply voltage VDD and the ground voltage GND (or the negative supply voltage VSS). The pull-up device PU may be turned off in response to the input voltage $V_{IN}$ having a high level, for example, the positive supply voltage VDD, and may be turned on in response to the input voltage $V_{IN}$ having a low level, for example, the ground voltage GND. On the other hand, the pull-down device PD may be turned off in response to the input voltage $V_{IN}$ having a low level, for example, the ground voltage GND, and may be turned on in response to the input voltage $V_{IN}$ having a high level, for example, the positive supply voltage VDD. Accordingly, similar to a binary logic circuit, the output voltage $V_{OUT}$ having a low level (e.g., GND) may be output in response to the input voltage $V_{IN}$ having a high level (e.g., VDD), and the output voltage $V_{OUT}$ having a high level (e.g., VDD) may be output in response to the input voltage $V_{IN}$ having a low level (e.g., GND).

The pull-up device PU and the pull-down device PD may have a constant current pass therethrough when being turned off. That is, the through current $I_{TP}$ of the pull-up device PU may be constant in a state in which the pull-up device PU is turned off, and the through current $I_{TN}$ of the pull-down device PD may also be constant in a state in which the pull-down device PD is turned off. In addition, a threshold voltage of the pull-up device PU may be lower than a threshold voltage of the pull-down device PD. Accordingly, when the input voltage $V_{IN}$ gradually increases from the ground voltage GND to the positive supply voltage VDD, the pull-up device PU may be turned off and then the pull-down device PD may be turned on. Therefore, both of the pull-up device PU and the pull-down device PD may be turned off between about 0.6 V to about 1.1 V, as in the input voltage $V_{IN}$-output voltage $V_{OUT}$ characteristics shown in FIG. 4.

As in the input voltage $V_{IN}$-through currents $I_{TP}$ and $I_{TN}$ characteristics shown in FIG. 4, when there is no current (i.e., $I_{ACC}$) applied to an output terminal of the inverter INV, magnitudes of the through current $I_{TP}$ of the pull-up device PU and the through current $I_{TN}$ of the pull-down device PD may match, and the through currents $I_{TP}$ and $I_{TN}$ may be constantly maintained at a low level between about 0.6 V and about 1.1 V. As a result, the output voltage $V_{OUT}$ may be maintained substantially constant at about 0.6 V and about 1.1 V due to the through current $I_{TP}$ of the pull-up device PU and the through current $I_{TN}$ of the pull-down device PD. That is, when the input voltage $V_{IN}$, for example, about half (VDD/2) of the positive supply voltage VDD is provided, the inverter INV may output the output voltage $V_{OUT}$ having an intermediate level, for example, about half (VDD/2) of the positive supply voltage VDD. Accordingly, when the ground voltage GND, an intermediate voltage VDD/2, and the positive supply voltage VDD respectively corresponding to the 0/1/2 logic values are input to the inverter INV, the inverter INV may output the positive supply voltage VDD, the intermediate voltage VDD/2, and the ground voltage GND respectively corresponding to the 2/1/0 logic values. Herein, the 'intermediate voltage' is assumed to be half (VDD/2) of the positive supply voltage VDD, but may be understood as a voltage having any level between the positive supply voltage VDD and the ground voltage GND.

In a case of the SRAM including two inverters which are cross-coupled, it may be required to have a characteristic that does not change a value stored in a memory cell in a read operation, for example, a high read SNM. Referring to FIG. 4, the inverter INV of FIG. 3 may provide a high read SNM despite an increase in an access current $I_{ACC}$ (e.g., despite the access current $I_{ACC}$ being higher than the through currents $I_{TP}$ and $I_{TN}$). As described above, a memory cell according to an example embodiment of the present disclosure may form different paths respectively in a read operation and a read operation, and thus may provide a high read SNM.

Figure 5:
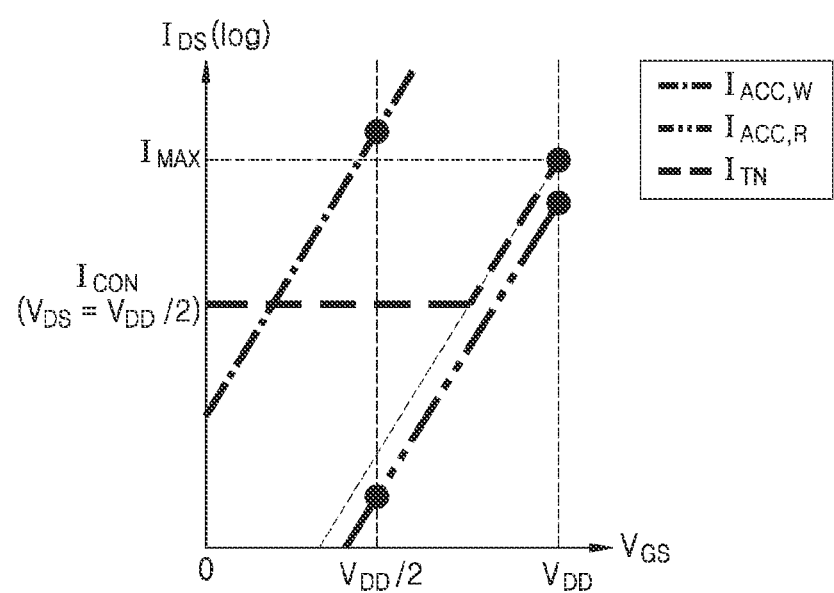
FIG. 5 is a graph showing characteristics of an access current of FIG. 3, according to an example embodiment of the present disclosure.

FIG. 5 is a graph showing characteristics of the access current $I_{ACC}$ of FIG. 3, according to an example embodiment of the present disclosure. In particular, FIG. 5 shows characteristics of such a transistor when the pull-down device PD of FIG. 3 is a transistor having a source, a drain, and a gate, and making a constant current to pass therethrough when being turned off, and shows characteristics of access currents $I_{ACC,W}$ and $I_{ACC,R}$ respectively in a read operation and a write operation. Hereinafter, FIG. 5 is described with reference to FIG. 3.

As described above with reference to FIG. 2, the memory cell M' may include the first inverter INV1 and the second inverter INV2 which are cross-coupled, and accordingly, a relatively high current may be applied to the first inverter INV1 and the second inverter INV2 to change a value stored in the memory cell M' in a write operation, and a relatively low current may be applied to the first inverter INV1 and the second inverter INV2 so as not to change a value stored in the memory cell M' in a read operation. That is, as described in FIG. 3, when a current applied from the outside to the output terminal of the inverter INV is defined as the access current $I_{ACC}$, the access current $I_{ACC,W}$ applied to the inverter INV in a write operation and the access current $I_{ACC,R}$ applied to the inverter INV in a read operation may satisfy [Equation 1] below.

$$I_{ACC,W} > I_T, I_{ACC,R} < I_T \qquad \text{[Equation 1]}$$

In [Equation 1], $I_T$ may correspond to a larger current among the thorough current $I_{TP}$ of the pull-up device PU and the through current $I_{TN}$ of the pull-down device PD in a write operation ($I_T$=max($I_{TP}$, $I_{TN}$)), and may correspond to a smaller current among the thorough current $I_{TP}$ of the pull-up device PU and the through current $I_{TN}$ of the pull-down device PD in a read operation ($I_T$=min($I_{TP}$, $I_{TN}$)).

Referring to FIG. 5, as indicated by a dashed line, the through current $I_{TN}$ of the pull-down device PD may have a magnitude '$I_{CON}$' at a gate-source voltage $V_{GS}$ equal to or less than the intermediate voltage VDD/2, gradually increase after the pull-down device PD is turned on as the gate-source voltage $V_{GS}$ increases, and have a magnitude '$I_{MAX}$' when the gate-source voltage $V_{GS}$ reaches the positive supply voltage VDD.

In a write operation, the access current $I_{ACC,W}$ may have a relatively large magnitude, and in some embodiments, when the access current $I_{ACC,W}$ is provided by a transistor (e.g., WT1 of FIG. 2), as indicated by the one-dot dashed line of FIG. 5, the transistor may provide the access current $I_{ACC,W}$ having a magnitude greater than the magnitude '$I_{MAX}$' at the intermediate voltage VDD/2. In addition, in a read operation, the access current $I_{ACC,R}$ may have a relatively small magnitude, and in some embodiments, when the access current $I_{ACC,R}$ is provided by a transistor, as indicated by the two-dot dashed line of FIG. 5, the transistor may provide the access current $I_{ACC,R}$ having a magnitude less than that of the through current $I_{TN}$ of the pull-down device PD at the intermediate voltage VDD/2 and less than the magnitude '$I_{MAX}$' at the positive supply voltage VDD. That is, transistors providing the access current $I_{ACC}$ may be designed to have the same or similar characteristics to that of the graph shown in FIG. 5.

Figure 6:
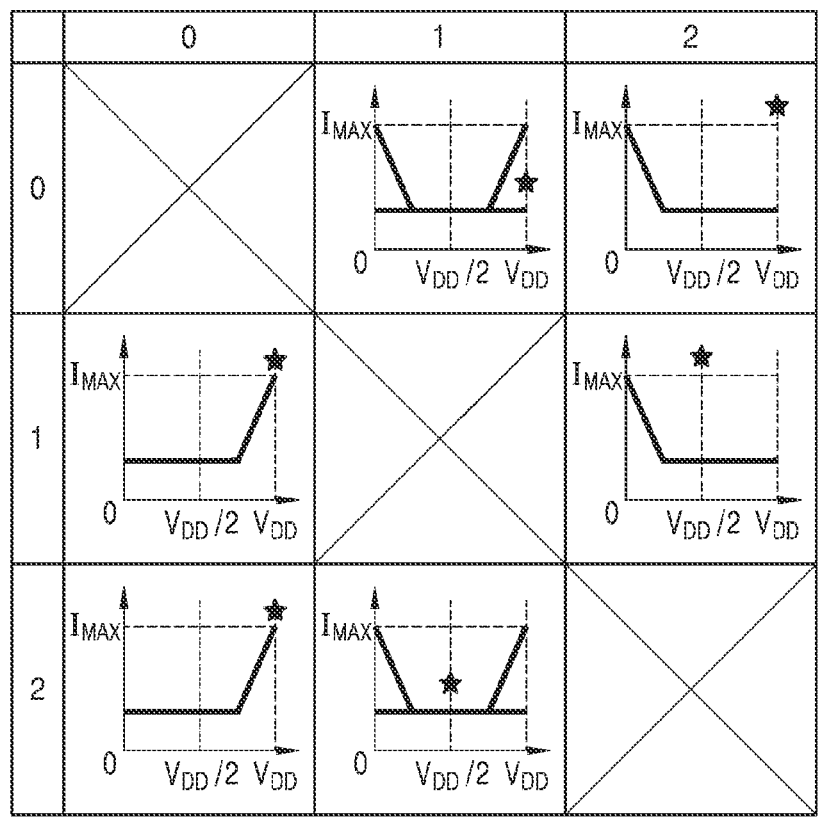
FIG. 6 is a table showing characteristics of an access current and an input voltage for a write operation, according to an example embodiment of the present disclosure.

FIG. 6 is a table showing characteristics of the access current $I_{ACC}$ and the input voltage $V_{IN}$ for a write operation, according to an example embodiment of the present disclosure. In particular, FIG. 6 shows characteristics of the access current $I_{ACC}$ and the input voltage $V_{IN}$ according to a value (hereinafter, referred to as a value stored in the memory cell M' of FIG. 2) corresponding to a current output of the inverter INV of FIG. 3 and a value (hereinafter, referred to as a value to be written into the memory cell M' of FIG. 2) corresponding to an output of the inverter INV to be changed.

Figure 7:
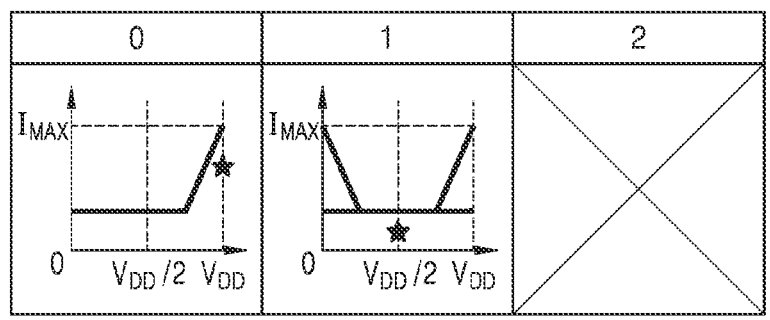
FIG. 7 is a table showing characteristics of an access current and an input voltage for a read operation, according to an example embodiment of the present disclosure.

In a table of FIG. 6, the column shows a value corresponding to a current output of the inverter INV, and the row shows a value corresponding to an output of the inverter INV to be changed. In the table, graphs in a first column in which the current output of the inverter INV corresponds to '0' respectively show lines representing characteristics of the pull-down device PD, graphs in a second column in which the current output of the inverter INV corresponds to '1' respectively show lines representing characteristics of the pull-up device PU and the pull-down device PD, and graphs in a third column in which the current output of the inverter INV corresponds to '2' respectively show lines representing characteristics of the pull-up device PU. In addition, in FIG. 6, the asterisk may indicate an operating point of an access transistor (e.g., the first write transistor WT1 connected to an output of the second inverter INV2 of FIG. 2) connected to an output of an inverter and through which the access current $I_{ACC}$ passes, and in this case, the horizontal axis of the graph represents a drain-source voltage $V_{DS}$ of the access transistor, and the vertical axis represents a current passing through the access transistor, that is, the access current $I_{ACC}$. FIG. 7 is a table showing characteristics of the access current $I_{ACC}$ and the input voltage $V_{IN}$ for a read operation, according to an example embodiment of the present disclosure. In particular, FIG. 7 shows the access current $I_{ACC}$ and the input voltage $V_{IN}$ according to a value (hereinafter, referred to as a value stored in the memory cell M' of FIG. 2) corresponding to the current output of the inverter INV of FIG. 3.

In a table of FIG. 7, the column shows a value corresponding to the current output of the inverter INV. In the table, a graph in a first column in which the current output of the inverter INV corresponds to '0' shows a line representing the characteristics of the pull-down device PD, and a graph in a second column in which the current output of the inverter INV corresponds to '1' shows lines representing the characteristics of the pull-up device PU and the pull-down device PD. In addition, in FIG. 7, the asterisk may indicate an operating point of an access transistor (e.g., the first read transistor RT1 connected to an output of the second inverter INV2 of FIG. 2) connected to an output of an inverter and through which the access current $I_{ACC}$ passes, and in this case, the horizontal axis of the graph represents a drain-source voltage $V_{DS}$ of the access transistor, and the vertical axis represents a current passing through the access transistor, that is, the access current $I_{ACC}$.

Figure 8:
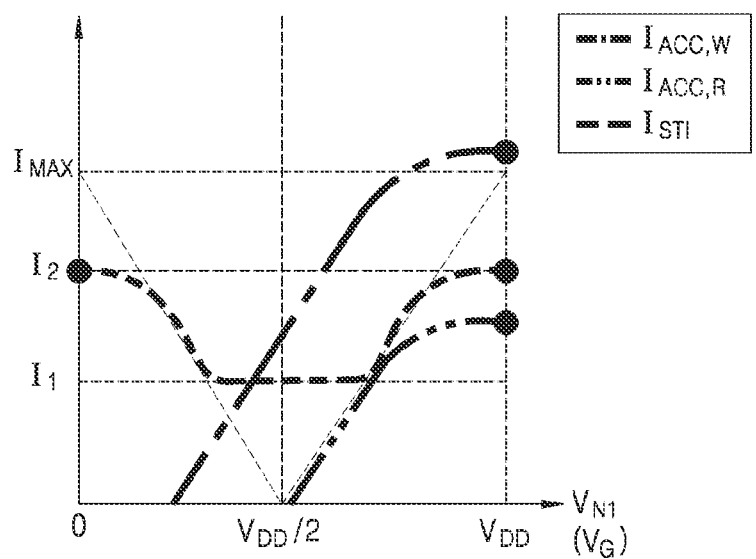
FIGS. 8 and 9 are graphs showing operations of the memory cell of FIG. 2, according to an example embodiment of the present disclosure.
Figure 9:
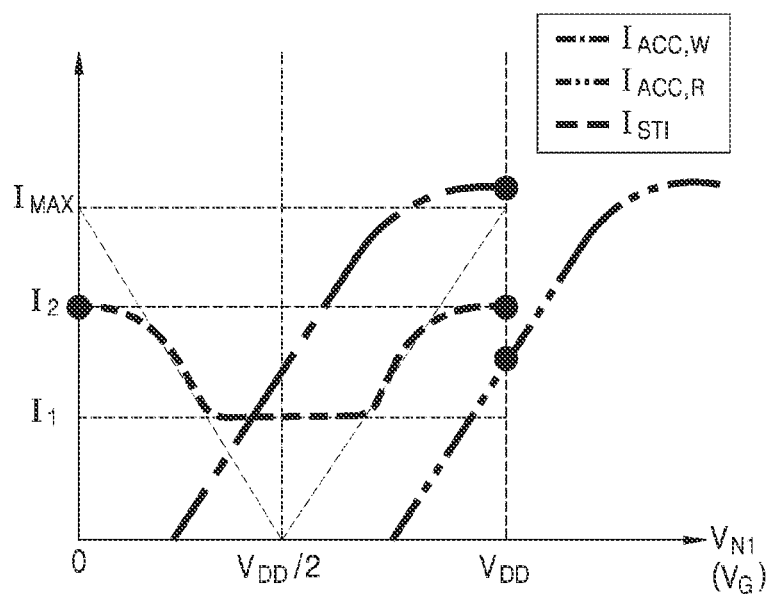

FIGS. 8 and 9 are graphs showing operations of the memory cell M' of FIG. 2, according to an example embodiment of the present disclosure. In particular, graphs of FIGS. 8 and 9 show currents and voltages in a read operation and a write operation of the memory cell M' of FIG. 2. Hereinafter, FIGS. 8 and 9 will be described with reference to the first write transistor WT1, the first read transistor RT1, and the second inverter INV2 of FIG. 2, and the second inverter INV2 is assumed to include the pull-up device PU and the pull-down device PD of FIG. 3. Duplicate contents in the description of FIGS. 8 and 9 will be omitted.

As described above with reference to FIGS. 2 and 3, at least one of the pull-up device PU and the pull-down device PD may be turned off according to a value stored in the memory cell M'. Accordingly, the second inverter INV2 may consume a constant current generated as the pull-up device PU and/or the pull-down device PD is/are turned off. For example, as indicated by a dashed line in FIG. 8, when the memory cell M' stores '1', that is, when a voltage $V_{N1}$ of the first node N1 is the intermediate voltage VDD/2, a first current $I_1$ may pass through the pull-up device PU and the pull-down device PD. In some embodiments, a magnitude of a constant current passing through the pull-up device PU and the pull-down device PD may vary according to a value stored in the memory cell M'. For example, as shown in FIG. 8, when the memory cell M' stores '0' ($V_{N1}$=0) or '2' ($V_{N1}$=VDD), a second current $I_2$ may pass through the pull-up device PU and the pull-down device PD, and the second current $I_2$ may be greater than the first current $I_1$. That is, both of the first current $I_1$ and the second current $I_2$ are currents (or sub-threshold currents) which pass when the pull-up device PU and/or the pull-down device PD is/are turned off, but when both of the pull-up device PU and the pull-down device PD are turned off, the first current $I_1$ passing through the same may be smaller.

In some embodiments, to normally read a value stored in the memory cell M' and normally write a value to be stored in the memory cell M', the first write transistor WT1 and the first read transistor RT1 may have similar threshold voltages and may have different sizes (e.g., channel widths, channel lengths). For example, as shown in FIG. 8, the first write transistor WT1 and the first read transistor RT1 may have similar threshold voltages between the intermediate voltage VDD/2 and the positive supply voltage VDD. The first write transistor WT1 may have a size in which a current greater than the second current $I_2$ passes therethrough by a voltage (e.g., VDD) of the write word line WWL which is activated, as shown in the one-dot dashed line in FIG. 8. On the other hand, the first read transistor RT1 may have a size in which has a current less than the second current $I_2$ passes therethrough by a voltage (e.g., VDD) of the read word line RWL which is activated, as shown in the two-dot dashed line.

In some embodiments, to normally read a value stored in the memory cell M and normally write a value to be stored in the memory cell M', the first write transistor WT1 and the first read transistor RT1 may have different threshold values. For example, as shown in FIG. 9, the first write transistor WT1 may have a threshold voltage between the intermediate voltage VDD/2 and the positive supply voltage VDD, and accordingly, may be turned on by a voltage (e.g., VDD) of the write word line WWL which is activated, thereby making a current which is greater than the second current $I_2$ to pass therethrough. On the other hand, the first read transistor RT1 may have a threshold voltage greater than or equal to the positive supply voltage VDD, and accordingly, may be maintained in a turned-off state by a voltage (e.g., VDD) of the read word line RWL which is activated, thereby making a sub-threshold current which is less than the second current $I_2$ to pass therethrough.

Figure 10:
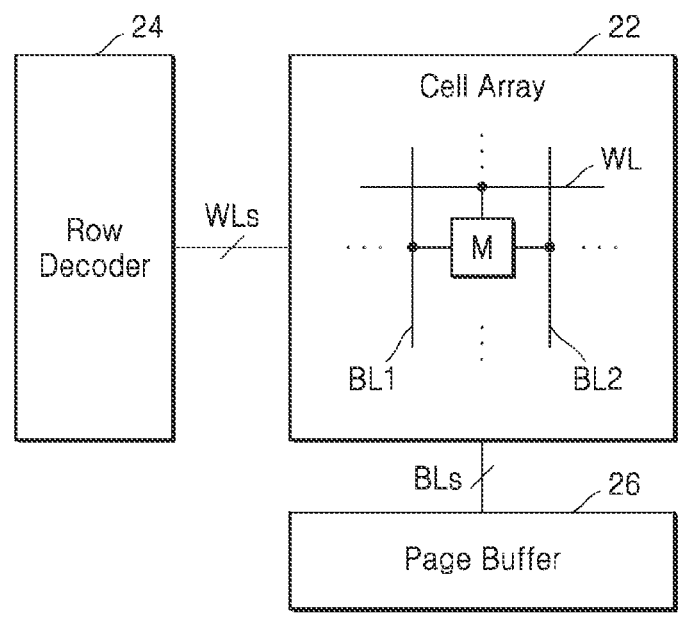
FIG. 10 is a block diagram of a memory device according to an example embodiment of the present disclosure.

FIG. 10 is a block diagram of a memory device 20 according to an example embodiment of the present disclosure. Similarly to the memory device 10 of FIG. 1, the memory device 20 of FIG. 10 may include a cell array 22, a row decoder 24, and a page buffer 26, and the cell array 22 may include a plurality of memory cells M. One of the plurality of memory cells M may have three different states respectively corresponding to ternary logic values.

The cell array 22 may be connected to the row decoder 24 through a plurality of word lines WLs, and may be connected to the page buffer 26 through a plurality of bit lines BLs. The memory cell M may be connected to one word line WL from among the plurality of word lines WLs, and may be connected to a first bit line BL1 and a second bit line BL2 from among the plurality of bit lines BLs. As will be described with reference to FIG. 11, the memory cell M may form the same path in a write operation and a read operation, and the memory cell M may have a reduced area while storing an increased amount of information. As a result, the degree of integration of the cell array 22 may be improved.

The row decoder 24 may activate one word line (e.g., WL) from among the plurality of word lines WLs according to an address accompanying a write command or a read command. Unlike the memory device 10 of FIG. 1 in which write word lines and read word lines are separated, in the memory device 20 of FIG. 10, the row decoder 24 may activate one of the plurality of word lines WLs by applying different voltages according to a read operation and a write operation.

Figure 11:
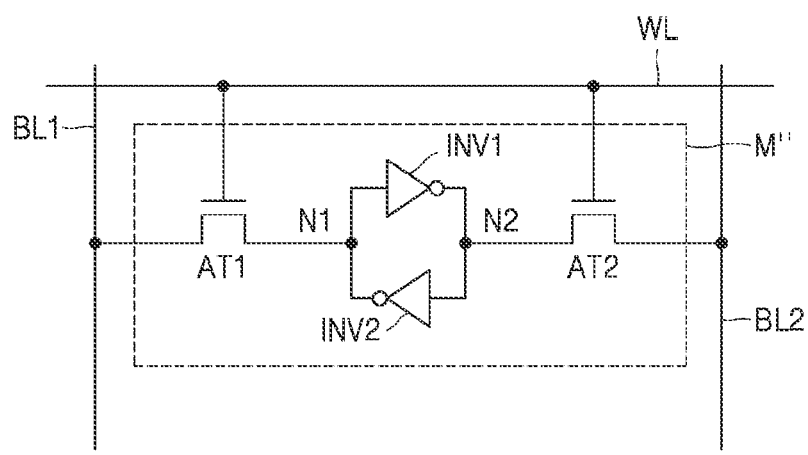
FIG. 11 is a circuit diagram illustrating an example of a memory cell of FIG. 10, according to an example embodiment of the present disclosure.

FIG. 11 is a circuit diagram illustrating an example of the memory cell M of FIG. 10, according to an example embodiment of the present disclosure. As described below with reference to FIG. 10, a memory cell M" of FIG. 10 may be connected to the word line WL, the first bit line BL1, and the second bit line BL2, and may have one logic value from among ternary logic values, that is, 0/1/2. Hereinafter, FIG. 11 will be described with reference to FIG. 10, and descriptions already give with reference to FIG. 2 will be omitted.

Referring to FIG. 11, the memory cell M" may include a first inverter INV1, a second inverter INV2, a first access transistor AT1, and a second access transistor AT2. The first inverter INV1 and the second inverter INV2 may be cross-coupled in a first node N1 and a second node N2, and thus, may store one logic value from among 0/1/2.

The first access transistor AT1 may be connected to the first node N1 and the first bit line BL1, and may have a gate (or a control terminal) connected to the word line WL. The first access transistor AT1 may electrically connect or disconnect the first node N1 and the first bit line BL1 according to a voltage of the word line WL. In addition, when the first access transistor AT1 electrically connects the first node N1 to the first bit line BL1, the first access transistor AT1 may have currents having different magnitudes pass therethrough according to the voltage of the word line WL. Accordingly, the row decoder 24 of FIG. 10 may control the magnitude of a current passing through the first access transistor AT1 by providing voltages having different magnitudes to the word line WL according to a read operation and a write operation.

Similarly to the first access transistor AT1, the second access transistor AT2 may be connected to the second node N2 and the second bit line BL2, and may have a gate (or a control terminal) connected to the word line WI. The second access transistor AT2 may electrically connect or disconnect the second node N2 and the second bit line BL2 according to a voltage of the word line WL. In addition, when the second access transistor AT2 electrically connects the second node N2 to the second bit line BL2, the second access transistor AT2 may have currents having different magnitudes pass therethrough according to the voltage of the word line WL. Although the first access transistor AT1 and the second access transistor AT2 are illustrated as NFETs in FIG. 11, embodiments of the present disclosure may also be applied even to a case where the first access transistor AT1 and the second access transistor AT2 are PFETs.

Figure 12:
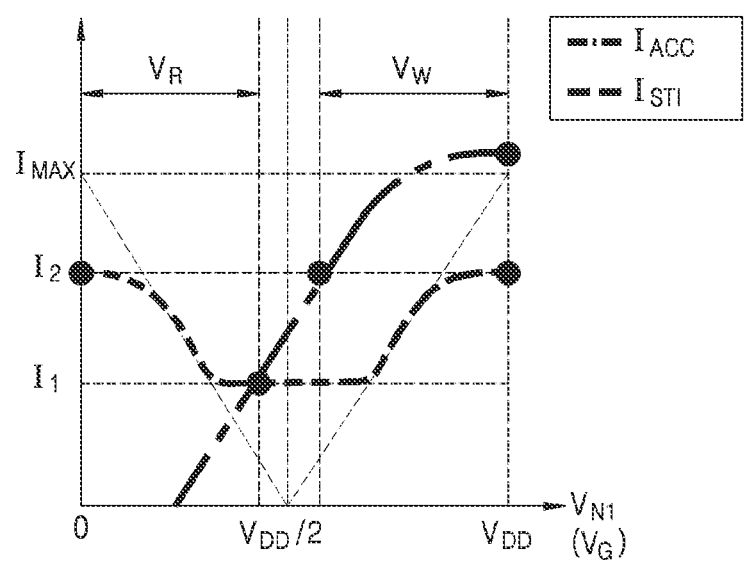
FIG. 12 is a graph showing an operation of the memory cell of FIG. 11, according to an example embodiment of the present disclosure.

FIG. 12 is a graph showing an operation of the memory cell M" of FIG. 11, according to an example embodiment of the present disclosure. In particular, a graph of FIG. 12 show currents and voltages in a read operation and a write operation of the memory cell M" of FIG. 11. Hereinafter, FIG. 12 will be described with reference to the first access transistor AT1 and the second inverter INV2 of FIG. 11, and the second inverter INV2 is assumed to include the pull-up device PU and the pull-down device PD of FIG. 3. Descriptions of FIG. 12 already give with reference FIGS. 8 and 9 will be omitted.

In some embodiments, to normally read a value stored in the memory cell M" and normally write a value to be stored in the memory cell M", a gate voltage of the first access transistor AT1, that is, a voltage of the word line WL which is activated may be controlled. For example, as defined by a point where the one-dot dashed line and a second current $I_2$ intersect in FIG. 12, the row decoder 24 may provide a voltage in a region indicated by '$V_W$' of FIG. 12 to the word line WL in a write operation so that the first access transistor AT1 may have a current greater than the second current $I_2$ pass therethrough. As defined by a point where the one-dot dashed line and a first current $I_1$ intersect in FIG. 12, the row decoder 24 may provide a voltage in a region indicated by 'VR' of FIG. 12 to the word line WL in a read operation so that the first access transistor AT1 may have a current, which is less than the first current $I_1$, to pass therethrough. Accordingly, compared to the memory cell M' of FIG. 2, the memory cell M" may include a reduced number of transistors.

Figure 13:
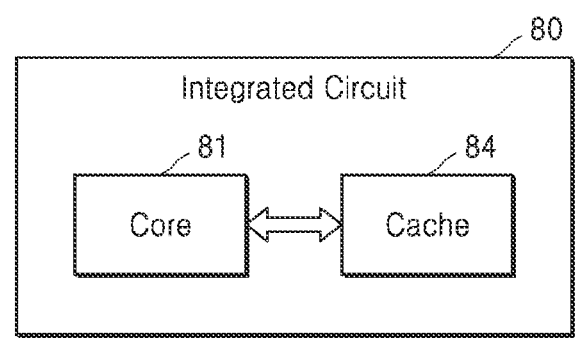
FIG. 13 is a diagram of an integrated circuit including a memory device according to an example embodiment of the present disclosure.

FIG. 13 is a diagram of an integrated circuit 80 including a memory device according to an example embodiment of the present disclosure.

The integrated circuit 80 may refer to any device that performs digital arithmetic operations, such as a central processing unit (CPU), a graphic processing unit (GPU), a digital signal processor, a communication processor (CP), an application processor (AP), or the like, as non-limiting examples. As shown in FIG. 13, the integrated circuit 80 may include a core 81 and a cache 84, and in some embodiments, the integrated circuit 80 may include a plurality of cores, that is, a multi-core.

A memory device according to example embodiments of the present disclosure described with reference to drawings may be included in the integrated circuit 80 as the cache 84 of the core 81 executing instructions. For example, the core 81 may execute a series of instructions stored in the cache 84 or process data stored in the cache 84 by the series of instructions. As described above with reference to the drawings, the cache 84, as a memory device according to example embodiments of the present disclosure, may provide a high storage capacity, improved operating speed, and operational reliability, and as a result, the performance and operational reliability of the integrated circuit 80 may be improved.

Example embodiments have been disclosed in the drawings and the present disclosure as described above. Although embodiments have been described using specific terms in the present disclosure, these are used only for the purpose of explaining the technical concept of the present disclosure but are not used to limit the present disclosure, and are not used to limit the meaning or scope of the present disclosure. Therefore, it will be understood by those skilled in the art that various modifications and equivalent other embodiments are possible therefrom. Accordingly, the true technical protection scope of the present disclosure should be defined by the technical spirit of the appended claims.

The invention claimed is:

1. A method of operating a memory device comprising a ternary memory cell, the method comprising:
    providing a first inverter and a second inverter cross-coupled in a first node and a second node and comprising a pull-up device and a pull-down device configured to have a constant current pass therethrough upon turn-off;
    providing a first read transistor and a first write transistor that are connected to each other in parallel between the first node and a first bit line;
    providing a second read transistor and a second write transistor that are connected to each other in parallel between the second node and a second bit line;
    causing a read access current, which is less than or equal to the constant current, to pass through the first read transistor and the second read transistor in response to an activated read word line; and
    storing a ternary value by causing the ternary memory cell to be in a state corresponding to one of the following states: a first state in which both of the pull-up device and the pull-down device are turned off, a second state in which the pull-up device is turned on and the pull-down device is turned off, and a third state in which the pull-up device is turned off and the pull-down device is turned on, wherein:
    the pull-up device and the pull-down device are configured to have a first current pass therethrough in the first state and a second current greater than the first current pass therethrough in the second state and the third state, and
    wherein the first read transistor and the second read transistor have greater threshold voltages than those of the first write transistor and the second write transistor.

2. The method of claim 1, further comprising:
    with a page buffer, determining a ternary value based on a difference between a first voltage of the first bit line and a second voltage of the second bit line in a read operation.

3. The method of claim 1, wherein the first write transistor and the second write transistor are configured to have a write access current, which is greater than or equal to the constant current, pass therethrough in response to an activated write word line.

4. The method of claim 1, wherein the first read transistor and the second read transistor have sizes less than sizes of the first write transistor and the second write transistor.

5. The method of claim 1, wherein the ternary memory cell state is in the first state, the method further comprising:
    causing the memory cell to be in the second state.

6. The method of claim 5, further comprising:
    causing the memory cell to be in the third state.

7. The method of claim 1, wherein the ternary memory cell is in the first state, the method further comprising:
    causing the ternary memory cell to be in the third state.

8. The method of claim 1, wherein the ternary memory cell state is in the second state or the third state, the method further comprising:
    causing the ternary memory cell to be in a different state being a different one of the first state, second state, or third state than the ternary memory cell.

9. A method of operating a memory device comprising a ternary memory cell storing a ternary value, the method comprising:
    providing a first inverter and a second inverter cross-coupled in a first node and a second node and comprising a pull-up device and a pull-down device configured to have a constant current pass therethrough upon turn-off;
    providing a first access transistor connected to the first node and a first bit line;
    providing a second access transistor connected to the second node and a second bit line;
    causing a row decoder configured to provide a read word line voltage to each of the first access transistor and the second access transistor such that a read access current which is less than or equal to the constant current passes through the first access transistor and the second access transistor in a read operation; and
    storing a ternary value in the ternary memory cell by causing the ternary memory cell to be in a state corresponding to one of the following: a first state in which both of the pull-up device and the pull-down device are turned off, a second state and a third state in which one of the pull-up device and the pull-down device is turned on and the other is turned off, wherein:
    the pull-up device and the pull-down device are configured to have a first current pass therethrough in the first state and have a second current, which is greater than the first current, pass therethrough in the second state and the third state, and
    wherein the row decoder is configured to provide a write word line voltage to each of the first access transistor and the second access transistor such that a write access current having a magnitude greater than or equal to the second current passes through the first access transistor and the second access transistor in a write operation.

10. The method of claim 9, further comprising:
with a page buffer, determining a ternary value based on a difference between a first voltage of the first bit line and a second voltage of the second bit line in the read operation.

11. The method of claim 9, wherein the ternary memory cell state is in the first state, the method further comprising:
causing the memory cell to be in the second state.

12. The method of claim 11, further comprising:
causing the memory cell to be in the third state.

13. The method of claim 9, wherein the ternary memory cell is in the first state, the method further comprising:
causing the ternary memory cell to be in the third state.

14. The method of claim 9, wherein the ternary memory cell state is in the second state or in the third state, the method further comprising:
causing the ternary memory cell to be in a different state being a different one of the first state, second state, or third state than the ternary memory cell.

15. A memory device comprising:
a page buffer comprising a latch and a read circuit comprising ternary logic devices, the page buffer being situated to determine a ternary value stored in a ternary memory cell based on a voltage difference between a first bit line and a second bit line of the ternary memory cell; and
the ternary memory cell, the ternary memory cell being coupled to the page buffer and comprising:
a first inverter and a second inverter cross-coupled in a first node and a second node and comprising a pull-up device and a pull-down device configured to have a constant current pass therethrough upon turn-off;
a first read transistor and a first write transistor which are connected to each other in parallel between the first node and the first bit line, the first bit line situated to be precharged by the ternary logic devices of the read circuit; and
a second read transistor and a second write transistor which are connected to each other in parallel between the second node and the second bit line, the second bit line situated to be precharged by the ternary logic devices of the read circuit,
wherein:
the first read transistor and the second read transistor are configured to have a read access current, which is less than or equal to the constant current, pass therethrough in response to an activated read word line,
the ternary memory cell is configured to store a ternary value corresponding to a first state in which both of the pull-up device and the pull-down device are turned off, a second state and a third state in which one of the pull-up device and the pull-down device is turned on and the other is turned off,
the pull-up device and the pull-down device are configured to have a first current pass therethrough in the first state and a second current greater than the first current pass therethrough in the second state and the third state, and
wherein the first read transistor and the second read transistor have greater threshold voltages than those of the first write transistor and the second write transistor.

16. The memory device of claim 15, wherein the page buffer further comprises:
a write circuit situated to write the ternary value to the ternary memory cell by applying voltages to the first bit line and the second bit line in a write operation that causes the ternary memory cell to be configured to one of: the first state, the second state, or the third state.

* * * * *